(12) United States Patent
Stuber et al.

(10) Patent No.: US 9,576,937 B2
(45) Date of Patent: Feb. 21, 2017

(54) BACK-TO-BACK STACKED INTEGRATED CIRCUIT ASSEMBLY

(71) Applicant: QUALCOMM INCORPORATED, San Diego, CA (US)

(72) Inventors: Michael A. Stuber, Rancho Santa Fe (CA); Stuart B. Molin, Calrsbad (CA)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/130,721

(22) Filed: Apr. 15, 2016

(65) Prior Publication Data
US 2016/0233198 A1    Aug. 11, 2016

Related U.S. Application Data

(62) Division of application No. 13/725,403, filed on Dec. 21, 2012, now Pat. No. 9,390,974.

(51) Int. Cl.
*H01L 25/065* (2006.01)
*H01L 21/78* (2006.01)
(Continued)

(52) U.S. Cl.
CPC ....... *H01L 25/0657* (2013.01); *H01L 21/6835* (2013.01); *H01L 21/6836* (2013.01); *H01L 21/78* (2013.01); *H01L 24/94* (2013.01); *H01L 25/50* (2013.01); *H01L 2221/68327* (2013.01); *H01L 2221/68381* (2013.01); *H01L 2224/16145* (2013.01); *H01L 2224/16225* (2013.01); *H01L 2224/48091* (2013.01); *H01L 2224/48137* (2013.01); *H01L 2224/48227* (2013.01); *H01L 2224/80006* (2013.01);
(Continued)

(58) Field of Classification Search
CPC ...... H01L 51/0072; H01L 51/56; C09K 11/06; C09K 11/025; C09K 2211/1007
See application file for complete search history.

(56) References Cited

U.S. PATENT DOCUMENTS 4,053,916 A    10/1977    Cricchi et al.
4,939,568 A    7/1990    Kato et al.
(Continued)

FOREIGN PATENT DOCUMENTS

CN    1784785 A    6/2006
CN    101140915 A    3/2008
(Continued)

OTHER PUBLICATIONS

Guarini K.W., et al., "Electrical integrity of state-of-the-art 0.13 μ, SOI CMOS devices and circuits transferred for three-dimensional (3D) integrated circuit (IC) fabrication," in Electron Devices Meeting, 2002, Dec. 8-11, 2002, pp. 943-945.
(Continued)

*Primary Examiner* — Andy Huynh
(74) *Attorney, Agent, or Firm* — Haynes and Boone, LLP

(57) ABSTRACT

An integrated circuit assembly includes a first substrate and a second substrate, with active layers formed on the first surfaces of each substrate, and with the second surfaces of each substrate coupled together. A method of fabricating an integrated circuit assembly includes forming active layers on the first surfaces of each of two substrates, and coupling the second surfaces of the substrates together.

18 Claims, 13 Drawing Sheets

(51) Int. Cl.
  *H01L 25/00* (2006.01)
  *H01L 21/683* (2006.01)
  *H01L 23/00* (2006.01)

(52) U.S. Cl.
  CPC .......... *H01L 2224/83005* (2013.01); *H01L 2224/94* (2013.01); *H01L 2225/0651* (2013.01); *H01L 2225/06517* (2013.01); *H01L 2225/06558* (2013.01); *H01L 2225/06565* (2013.01); *H01L 2924/12042* (2013.01); *H01L 2924/1305* (2013.01); *H01L 2924/13091* (2013.01)

(56) References Cited

U.S. PATENT DOCUMENTS

| | | |
|---|---|---|
| 5,229,647 A | 7/1993 | Gnadinger |
| 5,376,579 A | 12/1994 | Annamalai |
| 5,434,750 A | 7/1995 | Rostoker et al. |
| 5,489,792 A | 2/1996 | Hu et al. |
| 5,580,802 A | 12/1996 | Mayer et al. |
| 5,777,365 A | 7/1998 | Yamaguchi et al. |
| 5,793,107 A | 8/1998 | Nowak |
| 5,880,010 A | 3/1999 | Davidson |
| 5,955,781 A | 9/1999 | Joshi et al. |
| 5,999,414 A | 12/1999 | Baker et al. |
| 6,027,958 A | 2/2000 | Vu et al. |
| 6,080,608 A | 6/2000 | Nowak |
| 6,110,769 A | 8/2000 | Son |
| 6,121,659 A | 9/2000 | Christensen et al. |
| 6,153,912 A | 11/2000 | Holst |
| 6,180,487 B1 | 1/2001 | Lin |
| 6,180,985 B1 | 1/2001 | Yeo |
| 6,190,985 B1 | 2/2001 | Buynoski |
| 6,191,476 B1 | 2/2001 | Takahashi et al. |
| 6,229,187 B1 | 5/2001 | Ju |
| 6,320,228 B1 | 11/2001 | Yu |
| 6,329,722 B1 * | 12/2001 | Shih .................. H01L 23/53228 257/690 |
| 6,352,882 B1 | 3/2002 | Assaderaghi et al. |
| 6,437,405 B2 | 8/2002 | Kim |
| 6,483,147 B1 | 11/2002 | Lin |
| 6,498,370 B1 | 12/2002 | Kim et al. |
| 6,531,753 B1 | 3/2003 | Lin |
| 6,566,240 B2 | 5/2003 | Udrea et al. |
| 6,573,565 B2 | 6/2003 | Clevenger et al. |
| 6,740,548 B2 | 5/2004 | Darmawan |
| 6,759,714 B2 | 7/2004 | Kim et al. |
| 6,833,587 B1 | 12/2004 | Lin |
| 6,847,098 B1 | 1/2005 | Tseng et al. |
| 6,889,429 B2 | 5/2005 | Celaya et al. |
| 6,900,501 B2 | 5/2005 | Darmawan |
| 7,052,937 B2 | 5/2006 | Clevenger et al. |
| 7,109,532 B1 | 9/2006 | Lee et al. |
| 7,135,766 B1 | 11/2006 | Costa et al. |
| 7,211,458 B2 | 5/2007 | Ozturk et |
| 7,227,205 B2 | 6/2007 | Bryant et al. |
| 7,238,591 B1 | 7/2007 | Lin |
| 7,244,663 B2 | 7/2007 | Kirby |
| 7,402,897 B2 | 7/2008 | Leedy |
| 7,485,571 B2 | 2/2009 | Leedy |
| 7,541,644 B2 | 6/2009 | Hirano et al. |
| 7,713,842 B2 | 5/2010 | Nishihata et al. |
| 7,759,220 B2 | 7/2010 | Henley |
| 7,782,629 B2 | 8/2010 | Graydon et al. |
| 7,888,606 B2 | 2/2011 | Sakamoto et al. |
| 7,906,817 B1 | 3/2011 | Wu et al. |
| 8,013,342 B2 | 9/2011 | Bernstein et al. |
| 8,232,597 B2 | 7/2012 | Stuber et al. |
| 8,357,975 B2 | 1/2013 | Stuber et al. |
| 8,859,347 B2 | 10/2014 | Stuber et al. |
| 8,912,646 B2 | 12/2014 | Stuber et al. |
| 8,921,168 B2 | 12/2014 | Stuber et al. |
| 9,029,201 B2 | 5/2015 | Nygaard et al. |
| 9,034,732 B2 | 5/2015 | Molin et al. |
| 2002/0027271 A1 | 3/2002 | Vaiyapuri |
| 2002/0041003 A1 | 4/2002 | Udrea et al. |
| 2002/0079507 A1 | 6/2002 | Shim et al. |
| 2002/0086465 A1 | 7/2002 | Houston |
| 2002/0089016 A1 | 7/2002 | Joly et al. |
| 2002/0163041 A1 | 11/2002 | Kim |
| 2002/0175406 A1 | 11/2002 | Callahan |
| 2004/0051120 A1 | 3/2004 | Kato |
| 2004/0150013 A1 | 8/2004 | Ipposhi |
| 2004/0245627 A1 | 12/2004 | Akram |
| 2004/0251557 A1 | 12/2004 | Kee |
| 2005/0124170 A1 | 6/2005 | Pelella et al. |
| 2005/0230682 A1 | 10/2005 | Hara |
| 2005/0236670 A1 | 10/2005 | Chien et al. |
| 2006/0065935 A1 | 3/2006 | Vandentop et al. |
| 2006/0183339 A1 | 8/2006 | Ravi et al. |
| 2006/0189053 A1 | 8/2006 | Wang et al. |
| 2006/0243655 A1 | 11/2006 | Striemer et al. |
| 2007/0018247 A1 | 1/2007 | Brindle et al. |
| 2007/0085131 A1 | 4/2007 | Matsuo et al. |
| 2007/0181992 A1 | 8/2007 | Lake |
| 2007/0254457 A1 | 11/2007 | Wilson et al. |
| 2007/0262428 A1 | 11/2007 | Summers |
| 2007/0262436 A1 | 11/2007 | Kweon et al. |
| 2008/0013013 A1 | 1/2008 | Kim et al. |
| 2008/0050863 A1 | 2/2008 | Henson et al. |
| 2008/0081481 A1 | 4/2008 | Frohberg et al. |
| 2008/0112101 A1 | 5/2008 | McElwee et al. |
| 2008/0124889 A1 | 5/2008 | Roggenbauer et al. |
| 2008/0128900 A1 | 6/2008 | Leow et al. |
| 2008/0150100 A1 | 6/2008 | Hung et al. |
| 2008/0165521 A1 | 7/2008 | Bernstein et al. |
| 2008/0283995 A1 | 11/2008 | Bucki et al. |
| 2008/0286918 A1 | 11/2008 | Shaviv |
| 2008/0288720 A1 | 11/2008 | Atwal et al. |
| 2008/0296708 A1 | 12/2008 | Wodnicki et al. |
| 2008/0308946 A1 | 12/2008 | Pratt |
| 2009/0011541 A1 | 1/2009 | Corisis et al. |
| 2009/0026454 A1 | 1/2009 | Kurokawa et al. |
| 2009/0026524 A1 | 1/2009 | Kreupl et al. |
| 2009/0073661 A1 | 3/2009 | Wolfe et al. |
| 2009/0160013 A1 | 6/2009 | Abou-Khalil et al. |
| 2010/0140782 A1 | 6/2010 | Kim et al. |
| 2010/0244934 A1 | 9/2010 | Botula et al. |
| 2010/0314711 A1 | 12/2010 | Farooq et al. |
| 2011/0140257 A1 | 6/2011 | Sweeney et al. |
| 2011/0266659 A1 | 11/2011 | Wilson et al. |
| 2012/0161310 A1 | 6/2012 | Brindle et al. |
| 2012/0205725 A1 | 8/2012 | Nygaard et al. |
| 2013/0043595 A1 | 2/2013 | Williams |
| 2014/0175637 A1 | 6/2014 | Stuber et al. |
| 2015/0069511 A1 | 3/2015 | Nygaard et al. |
| 2015/0108640 A1 | 4/2015 | Stuber et al. |
| 2015/0140782 A1 | 5/2015 | Stuber et al. |
| 2015/0249056 A1 | 9/2015 | Molin et al. |
| 2016/0284671 A1 | 9/2016 | Stuber et al. |

FOREIGN PATENT DOCUMENTS

| | | |
|---|---|---|
| EP | 0707338 A2 | 4/1996 |
| EP | 0986104 A1 | 3/2000 |
| GB | 2309825 A | 8/1997 |
| GB | 2418063 A | 3/2006 |
| JP | H02110974 A | 4/1990 |
| JP | H0311666 A | 1/1991 |
| JP | H04356967 A | 12/1992 |
| JP | H0798460 A | 4/1995 |
| JP | H09283766 A | 10/1997 |
| JP | 2001230423 A | 8/2001 |
| JP | 2004228273 A | 8/2004 |
| JP | 2005509294 A | 4/2005 |
| JP | 2005175306 A | 6/2005 |
| JP | 2006186091 A | 7/2006 |
| JP | 2007329379 A | 12/2007 |
| JP | 2008004577 A | 1/2008 |
| WO | WO-0225700 A2 | 3/2002 |

(56) References Cited

FOREIGN PATENT DOCUMENTS

WO     WO-2008011210 A1     1/2008
WO     WO 2009045859 A1     4/2009

OTHER PUBLICATIONS

International Search Report and Written Opinion dated Mar. 31, 2014 for PCT Application No. PCT/US2013/073466.
Matloubian, M. "Smart Body Contact for S01 MOSFETs", SOS/SOI Technology Conference, Oct. 3-5, 1989.
McDonald, F.C., "Thermal and Stress Analysis Modeling for 3D Memory over Processor Stacks", Sematech Manufacturing and Reliability Challenges for 3D ICs using TSVs, Sep. 25-26, 2008, San Diego, California.
Sleight J.W., et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.
Tan C.S., et al., "Wafer Level 3-D ICs Process Technology," Series on Integrated Circuits and Systems, 2008, Springer, chapters 4, 5, 6, 8, 9, 10, and 12 (entire).

\* cited by examiner

BACK-TO-BACK STACKED INTEGRATED CIRCUIT ASSEMBLY

CROSS-REFERENCE TO RELATED PATENT APPLICATIONS

This application is a divisional of U.S. patent application Ser. No. 13/725,403, filed Dec. 21, 2012, and titled, "Back-to-back stacked integrated circuit assembly and method for making." This application is related to Stuber et al., U.S. patent application Ser. No. 13/725,245. "Thin integrated circuit chip-on-board assembly and method of making", and to Stuber et al., U.S. patent application Ser. No. 13/725,306, "Semiconductor-on-insulator integrated circuit assembly and method of making", both filed on even date herewith, owned by the assignee of the present application, and hereby incorporated by reference.

BACKGROUND

Electronic devices are continuously offering more functionality in smaller packages. This is enabled, in part, by integrating more capability—processing power, memory, etc.—onto individual integrated circuit chips. However, also important in the development of small, powerful devices is the ability to fit more of the integrated circuit chips themselves into smaller packages.

Integrated circuit chips are typically attached to printed circuit boards. These boards contain one or more layers of metal traces and vias, providing electrical connections to chips and other components, thus completing the electronic system. By using innovative ways of attaching their component chips, boards can be made smaller in order to fit into smaller devices.

Integrated circuit chips can be attached to printed circuit boards in several ways. Often they are mounted in packages that have various configurations of pins, which, in turn, are inserted into holes in the printed circuit boards and fixed in place. For a smaller outline, the packaging step can be omitted, and the chip can be mounted directly on the board. A common chip mounting technique—for mounting chips both in packages and directly on boards—is wire bonding. In this method, thin wires connect pads in the package, or on the board, to pads on the chip. Usually, these bonding pads lie along the outside edges of the upper surface of the chip.

Since the board area needed for a wire-bonded chip exceeds the chip area by the length of the wires, other methods are available to replace wire bonding. In a second method, known as flip-chip or C4 (for controlled collapse chip connection), bond pads on the chip are coated with solder bumps, and the chip is mounted face down on the board. In this method, the footprint on the board used by the chip is no larger than the area of the chip. Eliminating the long wires may have performance advantages as well.

Another method of reducing board size is to stack chips on top of each other, while still being electrically connected to the board. Designers often find it advantageous to stack related chips—for example, a memory chip and its controller. In this case, the upper chip is usually connected directly to lower chip, and not necessarily to the board. Such a stacked chip assembly will typically require a vertical connection, such as a through-silicon via, to route signals and/or power to at least one of the chips. Such vertical connections, though expensive, can result in substantial package size reductions, especially if this technique is combined with flip-chip mounting. In these assemblies, both chips are either upside down, with C4 bumps formed on the lower chip; or they are mounted face-to-face, with the C4 bumps formed directly on vertical connectors.

In some cases, chip stacking may be beneficial but vertical connections are not required. For example, multiple identical memory chips may be connected to one controller chip, so as to increase memory capacity. In this case, the memory chips could be stacked and bonded individually to the printed circuit board, connecting them to the nearby controller chip. In these cases, both chips are typically mounted right side up, and both are wire bonded to the board. However, some of the area savings afforded by chip stacking is lost due to the area consumed by the multitude of wire bonds.

Thus, there is an increasing need to produce small, complex circuit boards in a cost-efficient manner.

As used herein and in the appended claims, the region in which circuitry is formed on a substrate is referred to an active layer. The circuitry referred to by the term "active layer" need not contain any active devices; rather, such a layer may contain a circuit comprising only passive devices. Examples of such passive circuits include bandpass fillers and resistor dividers.

SUMMARY

In one embodiment, an integrated circuit assembly includes a substrate having a first surface and a second surface, the first surface having an active layer formed in it. The first active layer includes a first metal pad. A second substrate having a first surface and a second surface, with a second active layer formed in the first surface, is provided such that the second surface of the second substrate is coupled to the second surface of the first substrate. The second active layer includes a second metal pad.

In another embodiment, a method of fabricating an integrated circuit assembly includes providing a first substrate having a first surface and a second surface. A first active layer is formed on the first surface of the first substrate. A second substrate having a first surface and a second surface, and further having a second active layer formed on its first surface, is provided. The second surface of the second substrate is coupled to the second surface of the first substrate.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION

An electronic assembly typically includes a plurality of integrated circuit chips attached to a printed circuit board. The printed circuit board contains wiring and connections that, with the attached integrated circuits, form a complete functional system. In order to minimize the footprint of such an assembly, integrated circuit chips are typically stacked on top of each other.

The current invention discloses a stacked-chip assembly and a method of stacking chips. The chip-stacking procedure presented is simple and low-cost. In embodiments of the present invention, methods are described in which integrated circuit chips are stacked back-to-back upon one another and electrically connected to a printed circuit board. In this configuration, bond pads on each chip are accessible without the need for vertical connections such as through-silicon vias. Vertical connections between chips often require expensive fine-accuracy alignment (<5 microns) of one chip to the other, since the vertical vias are often less than 5 microns in diameter, and spaced less than 5 microns apart. In the current invention, therefore, this expensive, highly accurate chip-to-chip alignment is not necessary.

In the current invention, one of the chips may be bonded to the board with solder bumps (the "flip chip" method) for a minimal chip outline area. One or both chips may be thinned, enabling a thinner board assembly—often necessary for a small, thin electronic device. In fact, the first chip may structurally support the second, so that the second chip may be thinned to 10 microns or less. Alternatively, the second chip may be a semiconductor-on-insulator (SOI), bonded to the first chip using layer transfer techniques, enabling an even thinner assembly.

Figure 1:
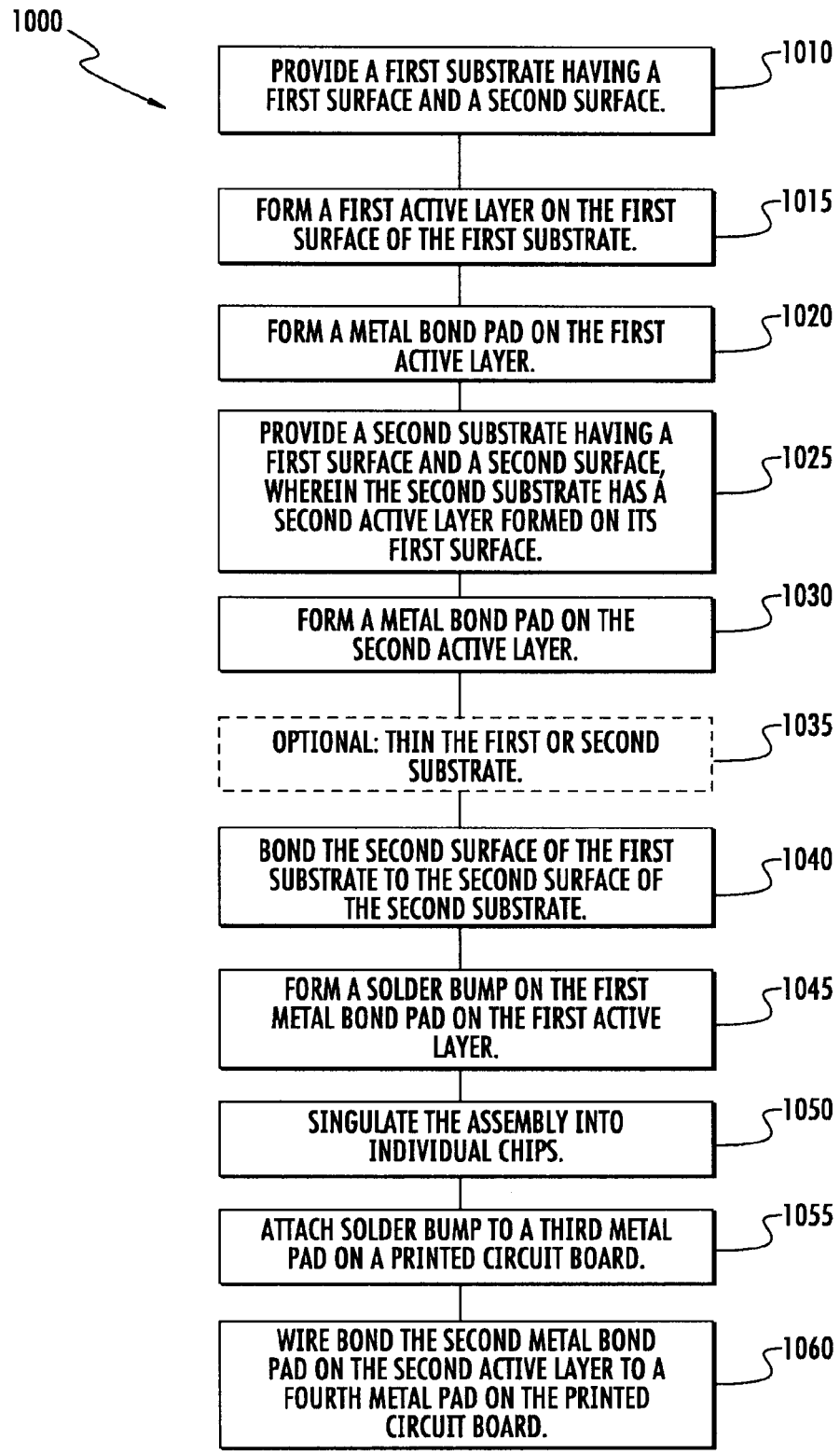
FIG. 1 is a flowchart of an exemplary method for forming a back-to-back stacked bulk integrated circuit.

FIG. 1 illustrates one embodiment of a method of the present disclosure, in which two integrated circuits formed on bulk semiconductor substrates are coupled back-to-back and attached to a printed circuit board so as to electrically connect both circuits to the board. In flowchart 1000 of FIG. 1, a first substrate, such as a silicon wafer, having a first surface and a second surface, is provided in step 1010. In step 1015, a first active layer is formed on the first surface of the first substrate, for example, by using a standard complementary metal-oxide-semiconductor (CMOS) fabrication process. Such a process may, for example, form transistors, contacts, and interconnect layers connected to form an integrated circuit. In step 1020, a metal bond pad is formed on the first active layer. This pad may electrically connect to an input, output, power, ground, or some other node of the integrated circuit formed in step 1015. Physically, this pad may connect to a metal interconnect layer formed as part of step 1015.

In step 1025, a second substrate having a first surface and a second surface, and further having a second active layer formed on its first surface, is provided. For example, the second substrate may be a second silicon wafer with an active layer formed on its first surface using a CMOS process, similar to step 1015. In step 1030, a metal bond pad is formed on second active layer. In one embodiment, this metal bond pad is similar to the bond pad formed on the first active layer in step 1020. In step 1035, either or both of the substrates may be thinned. Material may be removed from the second surface of either substrate by, for example, grinding. In step 1040, the second surface of the first substrate is bonded to the second surface of the second substrate. Any wafer bonding method that results in a permanent bond may be used; for example direct silicon or fusion bonding, permanent adhesive bonding, metallic inter-diffusion or eutectic bonding. Note that, in some embodiments, this step would include an alignment step, such that scribe lines on each substrate are roughly aligned to each other. In some embodiments, an insulating layer, for example, silicon dioxide, may be grown or deposited on the second surface of the first substrate, or the second surface of the second substrate, or both.

Still referring to FIG. 1, in step 1045, a solder bump is formed on the first metal bond pad on the first active layer. This step may include, for example, testing of the chips on each substrate prior to forming the solder bump. In step 1050, the bonded substrate assembly is optionally singulated into individual chips. The singulation step may include, for example, dicing with a saw. In step 1055, the solder bump is attached to a third metal pad on a printed circuit board. This step may be accomplished, for example, by completing the solder step; that is, by melting the solder bump so that it adheres to the material of the third metal pad on a printed circuit board. In step 1060, the second metal bond pad on the second active layer is wire bonded to a fourth metal pad on the printed circuit board. The resulting structure has two stacked integrated circuits, both of which are electrically connected independently to a printed circuit board.

Figure 2A:
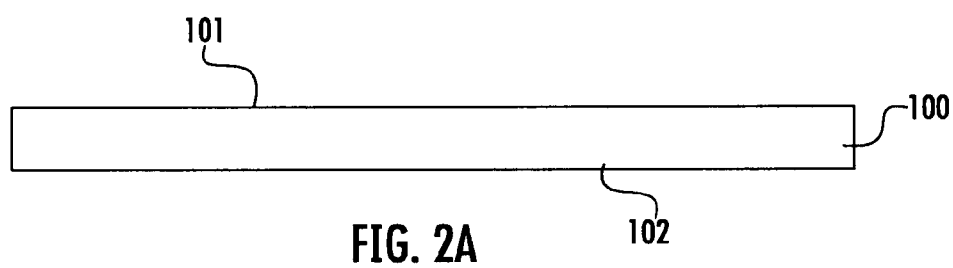
FIGS. 2a-2f illustrate cross-sectional views of stages of forming a back-to-back stacked integrated circuit according to some embodiments.
Figure 2B:
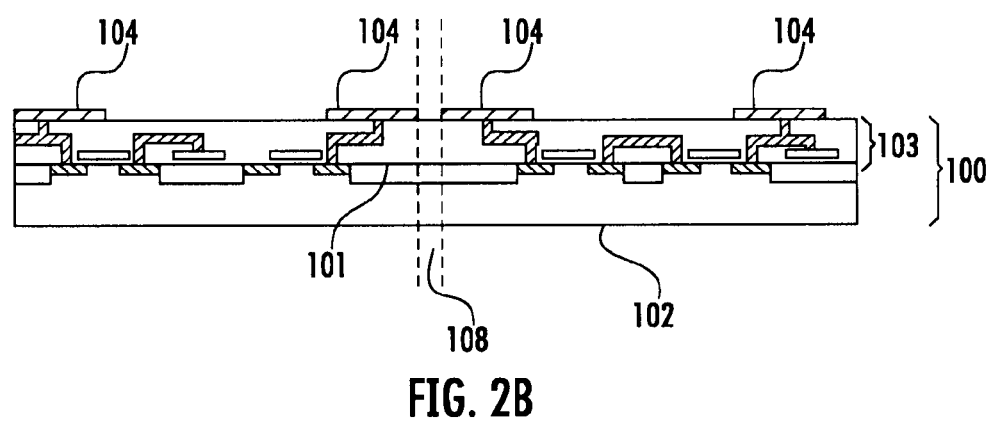

FIGS. 2*a*-2*f* illustrate an exemplary stacked integrated circuit fabricated according to the method of FIG. 1. In FIG. 2*a*, a first substrate 100, having a first surface 101 and a second surface 102, is provided. This substrate may be, for example, a silicon wafer which is, for example, 500 to 900 microns thick. Alternatively, this substrate may comprise a different semiconductor, for example, germanium, gallium arsenide, or gallium nitride, or it may comprise an insulator, for example, sapphire or quartz. In FIG. 2*b*, a first active layer 103 is formed on the first substrate 100. This active layer may include, for example, transistors (comprising, for example, gate, source, drain and body regions), isolation areas, contacts, and interconnect layers, forming a complete integrated circuit. This active layer could be formed with any of a number of integrated circuit fabrication sequences; for example, a CMOS process, or a CMOS process with a bipolar transistor (BiCMOS) or a process that forms high-power devices or optoelectronic devices in addition to MOS transistors. The active layer 103 may comprise a plurality of integrated circuits, separated by scribe fines 108. The width of these scribe lines may be, for example, 40 microns, or 80 microns. FIG. 2*b* also shows metal bond pads 104 formed in the first active layer. These metal pads may be made from any metal compatible with solder bumping or wire bonding; for example, copper or aluminum. The formation of the metal bond pads 104 in may also include the formation of a passivation layer, for example, silicon nitride or silicon oxynitride, to prevent the circuitry from reacting with its environment. Formation of the mend bond pads 104 would thus include forming pad openings to access the bond pads 104.

Figure 2C:
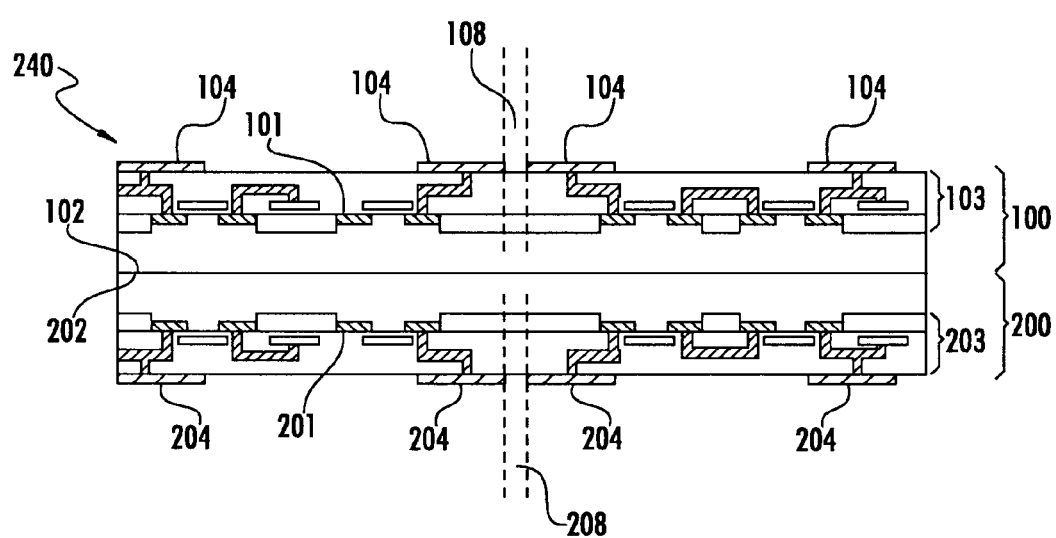

FIG. 2*c* shows a second substrate 200, which may be similar to the first substrate 100, having a first surface 201 and a second surface 202. The second substrate may be, for example, a silicon wafer of similar thickness to the first substrate (i.e., 500 to 900 microns), or a wafer of a different semiconductor, for example, germanium; or an insulator, for example, sapphire. This second substrate has an active layer 203 formed on its first surface 201; this active layer may be formed, for example, using a similar process to the process used to form the first active layer 101, or a different process, forming different circuit elements, may be used. The active layer 203 may also comprise a plurality of integrated circuits, separated by scribe lines 208. These scribe lines may be the same width as the scribe lines 108 on the first active layer 103. A second set of metal bond pads 204, formed in the second active layer 203, is also shown in FIG. 2c. These metal pads 204 may be made from a similar metal as the first metal bond pads 104, or they may be formed from a different metal. Similarly, the formation of the metal bond pads 204 may include the formation of a passivation layer. In FIG. 2c, the second surface 102 of the first substrate 100 and the second surface 202 of the second substrate 200 are bonded together, forming the bonded integrated circuit assembly 240.

Prior to this bonding step, either or both of the substrates 100 and 200 may be thinned, for example, to a final thickness of 150 microns, or 100 microns, or 80 microns, or 50 microns, or 30 microns, or 10 microns. If one substrate is not thinned to a point of structural instability (e.g., the substrate is greater than about 100 microns for silicon wafers), then the other substrate can be thinned substantially; for example, to 30 microns or 10 microns. In any case, the thinning step may be include, for example, first attaching the substrate's first surface 101 or 201 to an adhesive backgrind tape, or to a rigid handle wafer coated with adhesive. The substrate's second surface 102 or 202 then may undergo a mechanical or chemical-mechanical grinding step, or a purely chemical polishing step, or any combination of these.

Prior to bringing surfaces 102 and 202 together for bonding, the substrates 100 and 200 may be aligned to each other, using, for example, infrared imaging. The purpose of this alignment may be to align the scribe lines 108 and 208 on top of each other. Thus, the accuracy required of this alignment step is dependent upon, for example, the width of the scribe lines 108 and 208; for example, the alignment accuracy may be one fourth of the scribe line width, or 10 microns, or 20 microns. This is a less stringent accuracy than what is needed for, for example, aligning wafers that must have through-silicon via connections completed by the bonding. Such alignments may require less than 1 micron of accuracy. Thus, embodiments of the present invention may use less expensive equipment and processes for bonding than what is required to form other integrated circuit assemblies.

Also prior to bonding, a dielectric layer may be deposited on surfaces 102, or 202, or both. This could include a layer of, for example, silicon dioxide, or silicon nitride. Such a layer could be formed by, for example, plasma-enhanced chemical vapor deposition (PECVD). A dielectric layer on either, or both, of surfaces 102 and 202 may better isolate the circuits formed on substrates 100 and 200 from each other.

The second surfaces 102 and 202 of the two substrates 100 and 200 are then bonded together. Any of a number of methods for bonding may be used, including but not limited to: silicon direct or fusion bonding, permanent adhesive bonding (using, for example, benzocyclobutene or polyimide), or bonding using metallic interdiffusion or eutectic layers, such as copper, tin, or gold. These bonding techniques may take place under atmosphere, or in a vacuum, at temperatures, for example, of less than 450 degrees Celsius (° C.), or less than 350° C. or less than 250° C. or at room temperature. Some bonding techniques, for example, metallic interdiffusion bonding, require relatively high bonding pressures (for example, 60 kilonewtons); others, for example, adhesive bonding or fusion bonding, require light bonding pressure (for example, leas than 5 Newtons). Some bonding methods, such as direct or fusion bonding, may require a surface activation step, which may render each surface hydrophilic, allowing a van der Waals bond to form. Such an activation step may include a plasma treatment, a wet chemical treatment, or a combination of these. An annealing step at, for example, 400° C., may be required to convert the van der Waals bond to a covalent bond. Note that some bonding techniques, for example, adhesive or metallic interdiffusion bonding, require use of an intermediate layer (adhesive or metal, for example), which remains in the assembly (not shown in FIG. 2c). After bonding, any adhesive tape or rigid handle used in thinning either or both substrates 100 and 200 is usually removed. This can be accomplished, for example, using mechanical, thermal, or chemical means, or any combinations thereof.

Figure 2D:
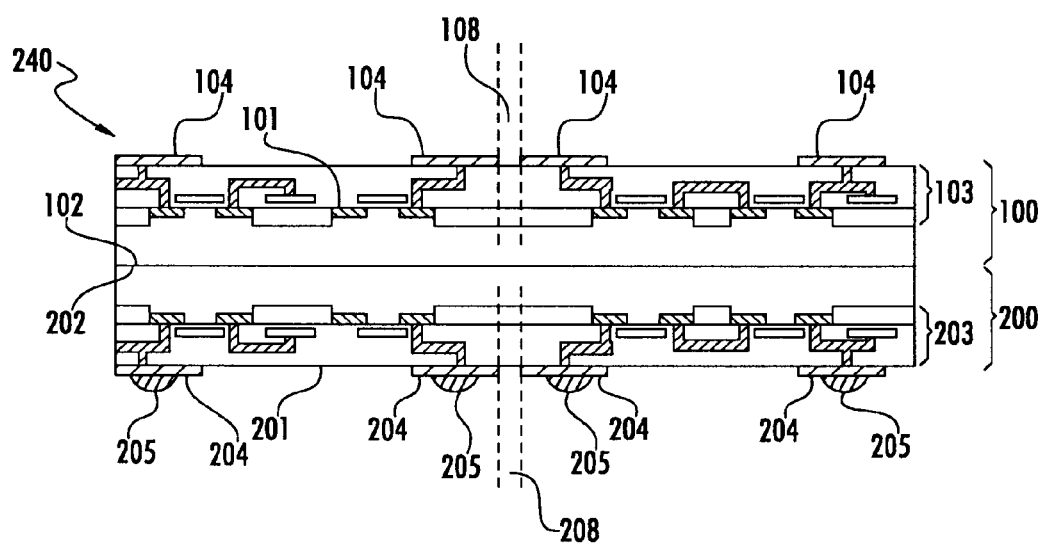

Turning to FIG. 2d, solder bumps 205 are applied to the metal pads 204 connected to active layer 203. The solder bumps may be comprised of, for example, lead, tin, copper, bismuth, silver, gallium, indium, or some combination thereof. The solder bumps may be 500 microns in diameter, or 100 microns in diameter, or 50 microns in diameter, or 25 microns in diameter, and they may be placed on 1 mm pitches, or 200 micron pitches, or 100 micron pitches, or 50 micron pitches. The solder bumps may be applied by any of a number of processes; for example, by plating, screen priming, evaporation, or transfer from a glass mold. Prior to attaching solder bumps, the metal pads 204 may have additional metal layers, for example, titanium, tin, tungsten, copper, or some combination thereof, deposited on them. Prior to application of the solder bumps 205, the integrated circuits formed in active layers 103 and 203 may be electrically tested.

Figure 2E:
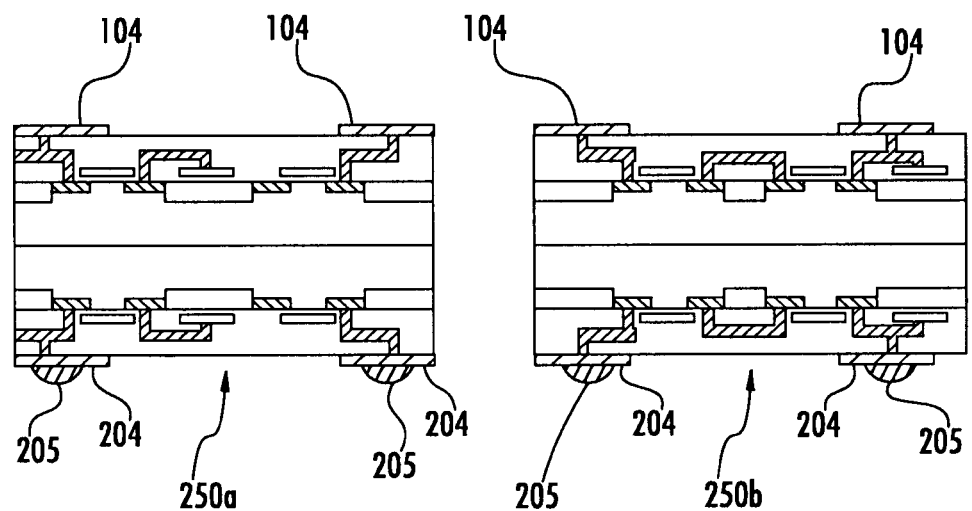

FIG. 2e shows two bonded integrated circuit assemblies 250a and 250b, formed by singulating the integrated circuit assembly 240 (FIG. 2d). This singulation process may use any of a number of methods to dice the bonded pair of wafers, for example, a mechanical saw, a laser cut, or a dry etch. The integrated circuit assemblies are separated along the scribe lines 108 and 208 (FIG. 2d).

Figure 2F:
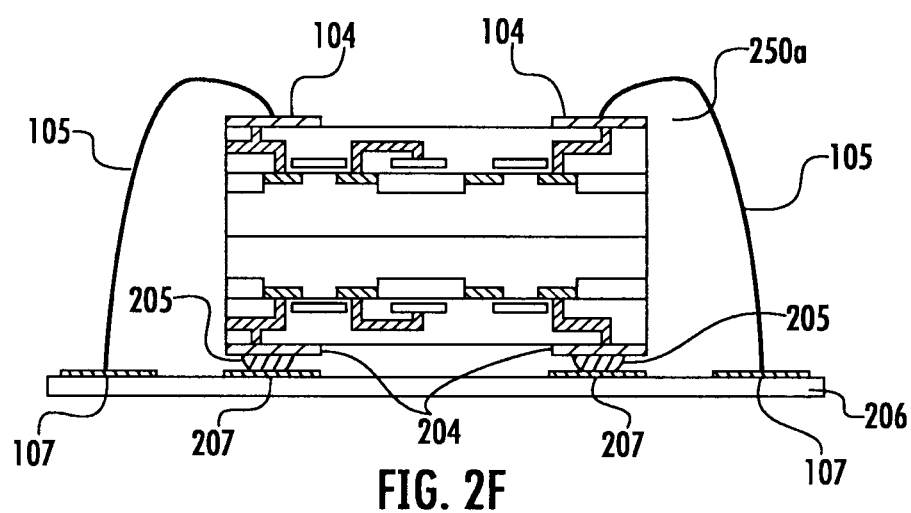

In FIG. 2f, the bumped assembly 250a is attached to a printed circuit board 206, on which metal pads 107 and 207 have been formed. These pads may be comprised of, for example, copper or aluminum. Assembly 250a is placed such that the solder bumps 205 are contacting metal pads 207. The solder bumps are then melted to form an electrical connection between pads 207 on printed circuit board 206, and pads 204 on active layer 203. This melting can be performed by, for example, ultrasonic soldering or reflow soldering. The temperature required for this melting may be, for example, about 250° C., or about 200° C., or about 150° C. Underfilling of the bonded assembly 250a, wherein a dielectric layer (not shown) is inserted between the assembly 250a and the board 206, may also be performed.

Also shown in FIG. 2f is the connection of the first active layer 103 to metal pads 107 on printed circuit board 206. This connection is made by use of wires 105. These wires may be comprised of, for example, aluminum, gold, or copper, which may be alloyed with, for example, beryllium or magnesium. To connect the wires 105 to the pads 107 and 104, any of a number of wire bonding processes may be used, including ball bonding or wedge bonding. The wires 105 are welded to pads 107 and 104 using heal, ultrasonic energy, pressure, or some combination thereof.

Figure 3:
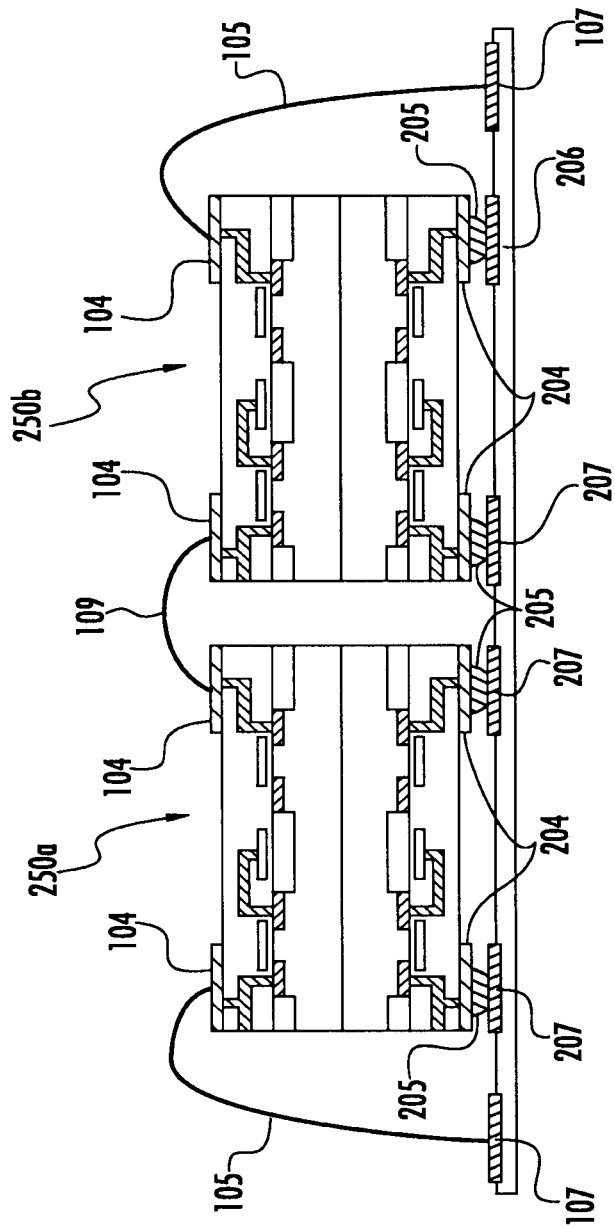
FIG. 3 is a cross-sectional view of another embodiment of a back-to-back stacked integrated circuit.

In FIG. 3, an alternative assembled structure is shown. In this structure, the first active layer 103 of integrated circuit assembly 250a may be electrically connected to active layer 103 of a second integrated circuit assembly 250b, instead of being connected to the printed circuit board 206. Such a connection may be established, for example, by wire bonding the pads 104 on assemblies 250a and 250b to each other using wire 109.

Figure 4A:
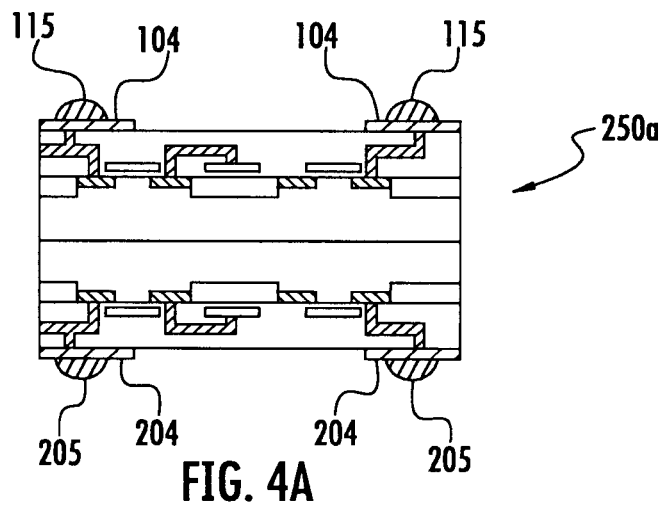
FIGS. 4a-b are cross-sectional views of another embodiment of a back-to-back stacked integrated circuit.
Figure 4B:
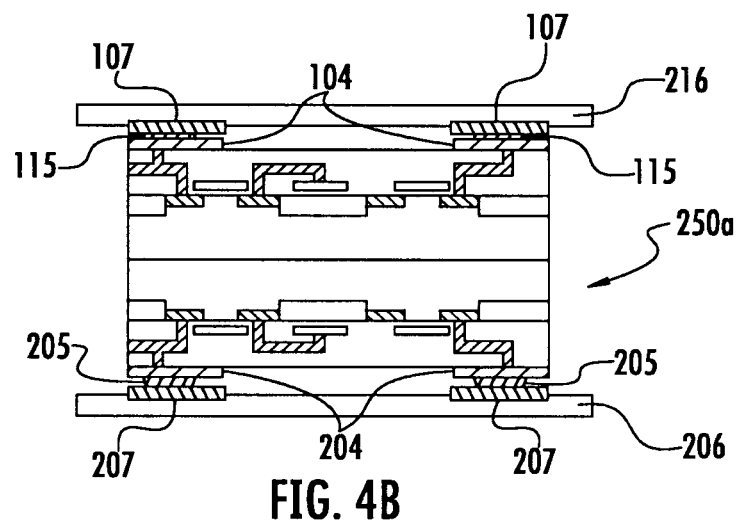

In FIGS. 4a-b, another alternative embodiment of an assembled structure is described. In FIG. 4a shows a single integrated circuit assembly 250a, with solder bumps 115 and 205 applied to the metal pads 104 and 204, respectively. In FIG. 4b, the bumped assembly 250a is attached to printed circuit boards 206 and 216, on which metal pads 207 and 107, respectively, have been formed. Assembly 250a is placed such that the solder bumps 205 are contacting metal pads 207, and the solder bumps 115 are contacting metal pads 107. The solder bumps are then melted to form electrical connections between pads 207 on printed circuit board 206 and pads 204 on active layer 203, as well as between pads 107 on printed circuit board 216 and pads 104 on active layer 103. This melting can be performed by, for example, ultrasonic soldering or reflow soldering.

Figure 5A:
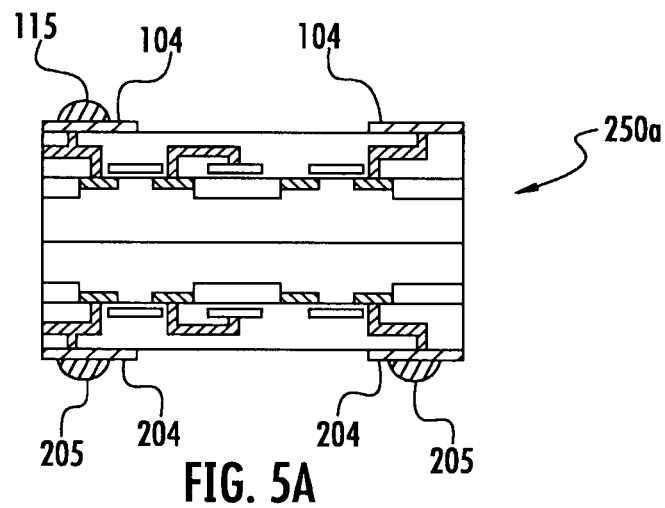
FIGS. 5a-5b are cross-sectional views of another embodiment of a back-to-back stacked integrated circuit, wherein a third integrated circuit is stacked on top of the back-to-back integrated circuit assembly.
Figure 5B:
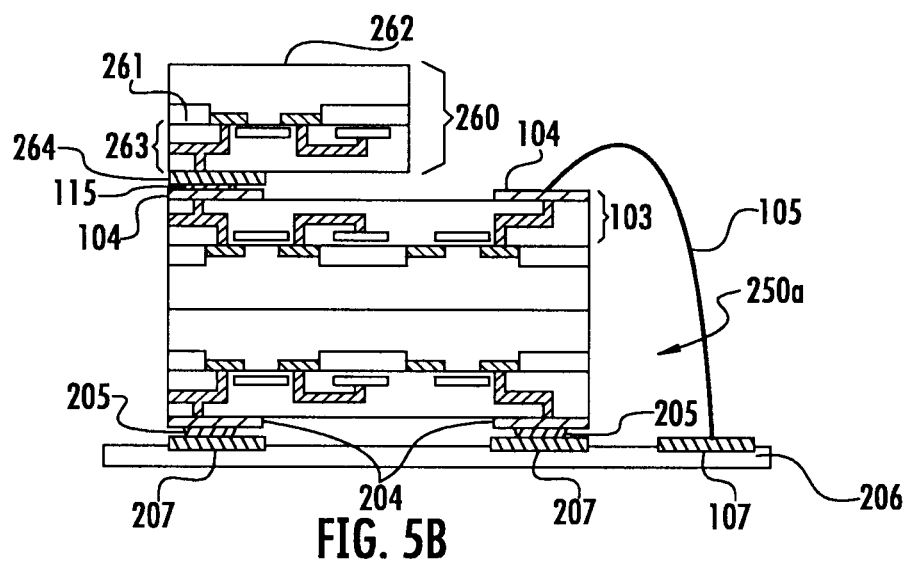

In FIGS. 5a-b, yet another alternative embodiment of an assembled structure according to the present invention is described. In this embodiment, three integrated circuits are stacked on top of each other and attached to a printed circuit board, in such a way as to provide all circuit elements in each of the three integrated circuits an electrical path to the printed circuit board. In FIG. 5a, solder bumps 115 are applied to some, but not all, of metal pads 104 of a single integrated circuit assembly 250a, in addition to the solder bumps 205 that are applied to pads 204. FIG. 5b shows a third substrate 260 having a first surface 261, a second surface 262, and an active layer 263 formed on the first surface 261. Pad 264 is formed in active layer 263. Third substrate 260 is placed such that pad 264 is contacting solder bump 115. FIG. 5b also shows a printed circuit board 206 having pads 207 and 107. Assembly 250a is placed such that the solder bumps 205 are contacting metal pads 207. The solder bumps are then melted to form electrical connections between pads 207 on printed circuit board 206 and pads 204 on active layer 203, as well as between pads 264 on substrate 260 and some of pads 104 on active layer 103. Finally, FIG. 5b also shows a wire 105 connecting other pads 104 to pads 107 on printed circuit board 206. In this way, circuit elements in the active layer 263 may have an electrical path to the printed circuit board 206 through circuit elements in active layer 103.

Figure 6:
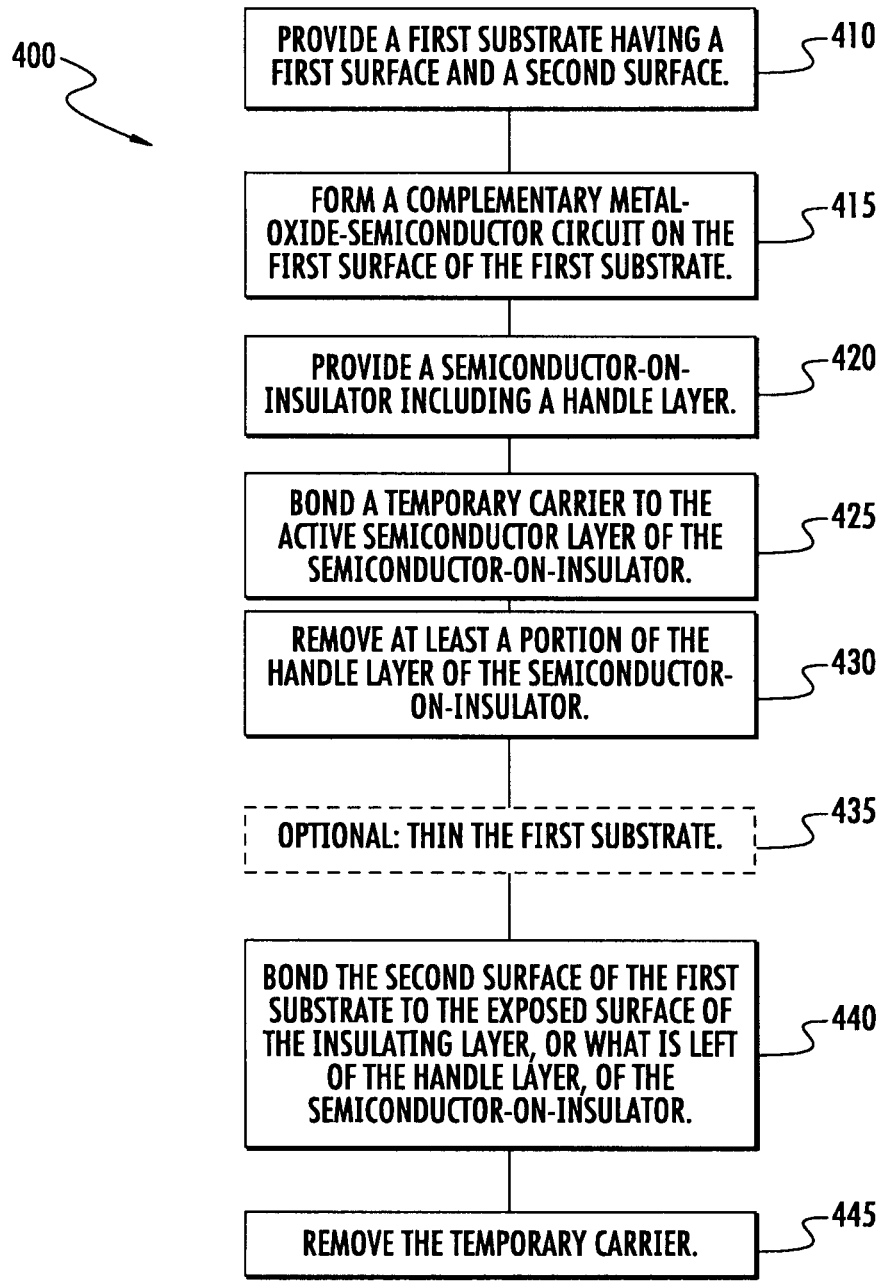
FIG. 6 is a flowchart of an exemplary method of transferring an SOI active layer to the back of a bulk CMOS integrated circuit.

FIG. 6 illustrates another embodiment of a method of the present disclosure, in which two integrated circuits, one of which is a semiconductor-on-insulator, are bonded back-to-back and attached to a printed circuit board so as to electrically connect both circuits to the board. In flowchart 400 of FIG. 6, a first substrate, such as a silicon wafer, having a first surface and a second surface, is provided in step 410. In step 415, a first active layer is formed on the first surface of the first substrate, for example, by using a standard complementary metal-oxide-semiconductor (CMOS) fabrication process, similar to step 1015 in the previous embodiment (FIG. 1).

In step 420, a semiconductor-on-insulator, including a handle layer, is provided. For example, the semiconductor-on-insulator, including a handle layer, may be comprised of a thin silicon layer and a thick silicon handle layer, with a thin layer of silicon dioxide disposed between them. An active layer is formed in the thin silicon layer, for example, using a CMOS process. In step 425, a temporary carrier is bonded to the active semiconductor layer. This could be accomplished, for example, by using a silicon wafer coated with a decomposable adhesive. The temporary carrier provides support for the semiconductor-on-insulator during the next step, 430, in which the handle layer of the supported semiconductor-on-insulator is wholly or partially removed. If the handle layer is left sufficiently thick, the bonding of the temporary carrier (step 425) may not be necessary. This removal step may include mechanical grinding or chemical polishing. Using similar mechanical or chemical means, the first substrate may be thinned in step 435. In step 440, the second surface of the first substrate is bonded to the exposed surface of the insulating layer, or what is left of the handle layer, of the semiconductor-on-insulator. Any wafer bonding method that results in permanent bond may be used, similar to step 1040 in the previous flowchart (FIG. 1). Again, this step may include an alignment step. In step 445, the temporary carrier that supported the semiconductor-on-insulator is removed. The resulting integrated circuit assembly may then be bumped, singulated, and attached to a printed circuit board in a manner similar to that described in steps 1045 to 1060 of FIG. 1.

Figure 7A:
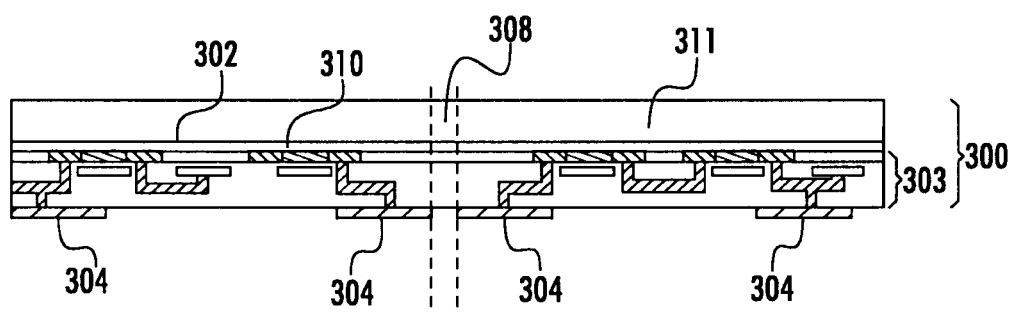
FIGS. 7*a*-7*f* illustrate cross-sectional views of stages of forming a stacked bulk CMOS/SOI integrated circuit according to some embodiments.

FIGS. 7a-7f illustrate an exemplary stacked integrated circuit fabricated according to the method of FIG. 6. In FIG. 7a, a semiconductor-on-insulator 300 is provided, comprising an active layer 303 and a handle layer 311, with an insulating layer 310 disposed between them. The insulating layer 310 has a surface 302 in contact with the handle layer 311. The handle layer 311 may be, for example, a silicon wafer which may be 500 to 900 microns thick. The insulator 310 may be, for example, silicon dioxide which may be 0.1 to 2 microns thick. The active layer 303 may be, for example, a thin silicon layer in which transistors (comprising, for example, gate, source, drain and body regions), isolation areas, contacts, and interconnect layers may have been formed. The thin silicon layer may be, for example, 0.05 to 3 microns thick. The active layer 303 may form a completed integrated circuit. This active layer could be formed with techniques similar to those described in the previous embodiment (FIG. 2b). Similarly, the active layer 303 may comprise a plurality of integrated circuits, separated by scribe lines 308. FIG. 7a also shows metal bond pads 304 formed in the active layer 303. Again, these metal pads may be made from any metal compatible with solder bumping or wire bonding; for example, copper or aluminum. Formation of the bond pads 304 may include formation of a passivation layer and pad openings in the passivation layer.

Figure 7B:
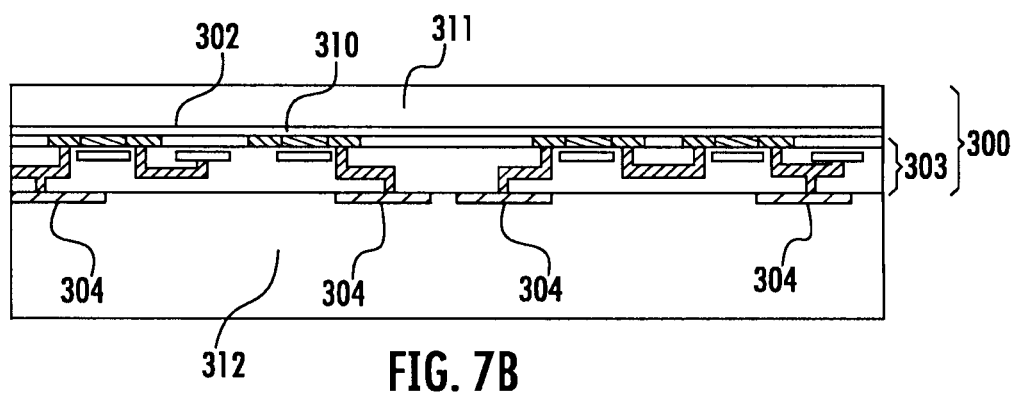

In FIG. 7b, a temporary carrier 312 is bonded to the active layer 303 of semiconductor-on-insulator 300. This temporary carrier may be, for example, a wafer comprising silicon, soda-lime or borosilicate glass, or sapphire. It may be coated with a bonding adhesive layer (not shown), which may comprise, for example, a synthetic wax, a thermoplastic polymer, or a ultraviolet (UV) curable polymer. The bonding process may comprise, for example, heating the temporary carrier and bringing it in contact with the semiconductor-on-insulator. A pressure of, for example, 1-5 Newtons per square centimeter ($N/cm^2$), or 10-50 $N/cm^2$, may be applied during bonding. If a UV-curable adhesive is used, the bonding step will include irradiation with UV light, typically through a transparent temporary carrier.

Figure 7C:
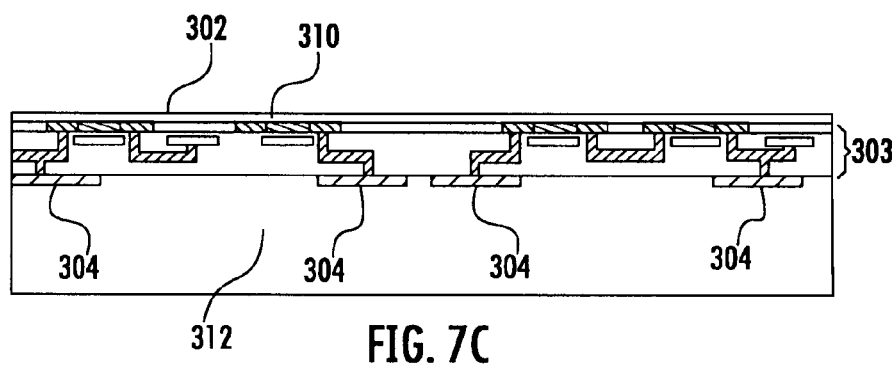

In FIG. 7c, the handle layer 311 is removed. This removal process may include, for example, a mechanical or chemical-mechanical grinding step, or a purely chemical polishing step, or a combination of these. Although not shown in FIG. 7c, a portion of the handle layer 311 may be left remaining on the insulator 310. If enough of the handle layer is left on the insulator 310, so that the semiconductor-on-insulator is self-supporting (for example, if 100 microns of the handle layer remains), the temporary carrier processing described above (FIG. 7b) may not be necessary.

Figure 7D:
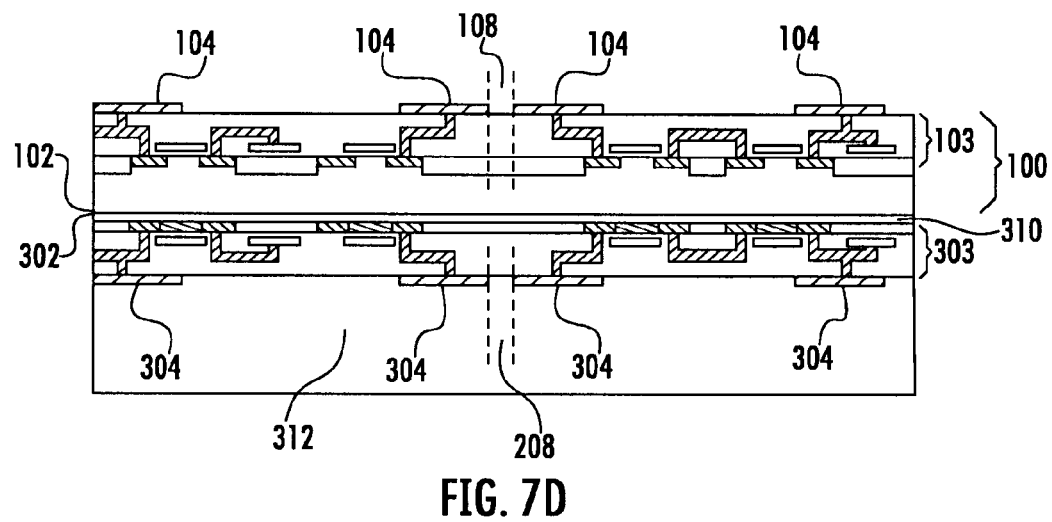

Turning to FIG. 7d, the active layer 303 and insulator 310, supported by the temporary carrier 312, are bonded to the second surface 102 of a substrate 100. The substrate 100 may be a silicon wafer, or a wafer of a different semiconductor, for example, germanium; or an insulator, for example, sapphire. The substrate 100 may be thinned prior to bonding; for example, by a process including attaching to an adhesive backgrind tape or to a rigid handle, and subsequently mechanically grinding or chemically processing, as described previously. Although FIG. 7d shows surface 302 of insulator 310 bonded to surface 102 of substrate 100, some of the remaining handle layer (not shown) may be interposed between surfaces 302 and 102. The bonding step depicted in FIG. 7d may include an alignment step in order to insure scribe lines 308 and 108 lie atop one another. The accuracy required of this alignment step is, for example, one fourth of the scribe line width, or 10 microns, or 20 microns. This is a less stringent accuracy than what is needed for, for example, aligning wafers that must have through-silicon via connections completed by the bonding. Note that a temporary carrier 312 that is transparent, for example, a glass carrier, may be advantageous for this alignment step.

The bonding method used in FIG. 7d may be any of the permanent methods mentioned previously, including but not limited to: silicon direct or fusion bonding, permanent adhesive bonding, or bonding using metallic interdiffusion or eutectic layers, such as copper, tin, or gold. Note that some bonding techniques, for example, adhesive or metallic interdiffusion bonding, require use of an intermediate layer (adhesive or metal, for example), which remains in the assembly (not shown in FIG. 7d).

Figure 7E:
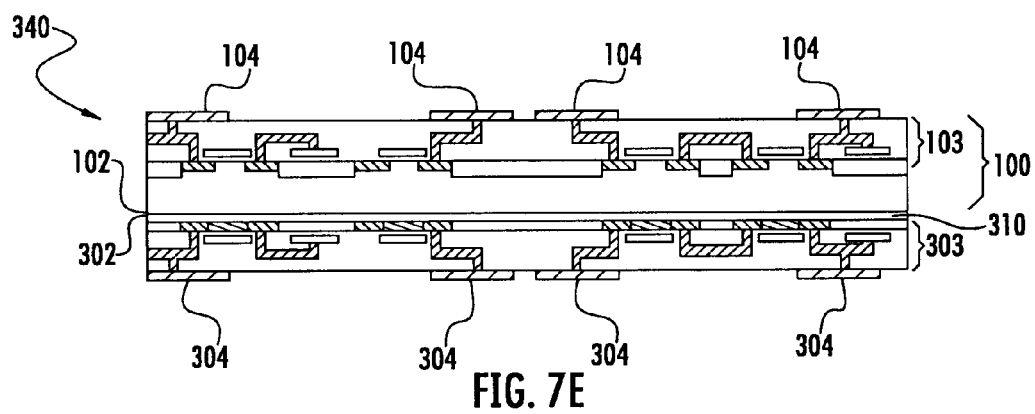
Figure 7F:
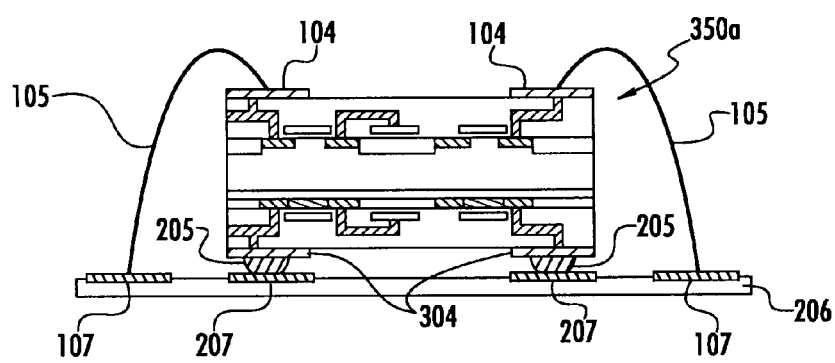

In FIG. 7e, the temporary carrier used 512 is removed, along with the adhesive tape or rigid handle used to support substrate 100 during thinning, if used. This can be accomplished, for example, using mechanical, thermal, or chemical means, or any combinations thereof. The result is a bonded integrated circuit assembly 340.

The assembly 340 then undergoes the same steps (not shown) discussed in the descriptions of FIG. 2d-2f above: testing, solder bumping, singulation, and soldering and wire bonding of the individual assemblies to a printed circuit board. FIG. 3f shows the final result: the integrated circuit assembly 350a attached to printed circuit board 206 having bond pads 107 and 207, where pads 304 of the integrated circuit assembly 350a are connected to circuit board pads 207 through solder bumps 205, and pads 104 of the integrated circuit assembly 350a are connected to circuit board pads 107 through wires 105.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. An integrated circuit assembly comprising:
   a first singulated portion of a first wafer having a substrate side and an active layer side; and
   a second singulated portion of a second wafer having a substrate side and an active layer side, wherein the first singulated portion and the second singulated portion are coupled substrate side-to-substrate side;
   the active layer side of the first singulated portion including a first metal bond pad; and
   the active layer side of the second singulated portion including a second metal bond pad, wherein the first singulated portion is thinner than the second singulated portion.

2. The integrated circuit assembly of claim 1, wherein the integrated circuit assembly does not include a vertical electrical connection through the first singulated portion and the second singulated portion.

3. The integrated circuit assembly of claim 1, further comprising:
   a first printed circuit board electrically coupled to the first metal bond pad by a first solder bump.

4. The integrated circuit assembly of claim 3, further comprising:
   a second printed circuit board electrically coupled to the second metal bond pad by a second solder bump.

5. The integrated circuit assembly of claim 3, further comprising:
   a bond wire electrically coupling the second metal bond pad to the first printed circuit board.

6. The integrated circuit assembly of claim 1, wherein the first singulated portion comprises a part of a semiconductor-on-insulator wafer.

7. The integrated circuit assembly of claim 6, wherein the second singulated portion does not comprise a part of a semiconductor-on-insulator wafer.

8. The integrated circuit assembly of claim 1, wherein the first active layer or the second active layer includes passive devices.

9. An integrated circuit assembly comprising:
   a first substrate having a first surface and a second surface,
   a first active layer formed on the first surface of the first substrate, the first active layer including a first metal bond pad;
   a second substrate having a first surface and a second surface, the second surface of the first substrate being coupled to the second surface of the second substrate, and
   a second active layer formed on the first surface of the second substrate, the second active layer including a second metal bond pad, wherein the second substrate is thinner than the first substrate.

10. The integrated circuit assembly of claim 9, further comprising:
    a printed circuit board, the printed circuit board being electrically coupled to the first active layer and the second active layer.

11. The integrated circuit assembly of claim 10 wherein the printed circuit board is electrically coupled to the second active layer through a wire bond.

12. The integrated circuit assembly of claim 9, wherein the printed circuit board is electrically coupled with a solder bump to the first active layer.

13. The integrated circuit assembly of claim 9, further comprising an insulating layer interposed between the second surface of the first substrate and the second surface of the second substrate.

14. The integrated circuit assembly of claim 9, wherein the first substrate comprises a portion of a semiconductor-on-insulator wafer.

15. The integrated circuit assembly of claim 14, wherein the second substrate does not include a portion of a semiconductor-on-insulator wafer.

16. A back-to-back stacked integrated circuit assembly comprising:
   a first singulated portion including a first semiconductor substrate with a first active layer disposed on the first semiconductor substrate;
   a second singulated portion including a second semiconductor substrate with a second active layer disposed on the second semiconductor substrate;
   a first metal pad on the first active layer;
   a second metal pad on the second active layer;
   wherein a surface of the first semiconductor substrate opposite the first active layer is coupled to a surface of the second semiconductor substrate opposite the second active layer; and
   a printed circuit board electrically coupled with the first metal pad by a solder bump, wherein the first semiconductor substrate is thinner than the second semiconductor substrate.

17. The back-to-back stacked integrated circuit assembly of claim 16, wherein the back-to-back stacked integrated circuit assembly does not include a vertical electrical connection through the first singulated portion and the second singulated portion.

18. The back-to-back stacked integrated circuit assembly of claim 16, wherein the first semiconductor substrate comprises a semiconductor-on-insulator substrate.

* * * * *